United States Patent [19]

Tizabi et al.

[11] Patent Number: 5,186,975
[45] Date of Patent: Feb. 16, 1993

[54] PROCESS AND MACHINERY FOR STEP-AND-REPEAT VACUUM-DEPOSITION OF LARGE-AREA THIN-FILM-ELECTRONICS MATRIX-CIRCUITS ON MONOLITHIC GLASS PANES THROUGH SMALL PERFORATED METAL MASKS

[75] Inventors: Djamshid Tizabi; Albert G. Fischer, both of Dortmund, Fed. Rep. of Germany

[73] Assignee: Enichem S.p.A., Milan, Italy

[21] Appl. No.: 734,102

[22] Filed: Jul. 24, 1991

Related U.S. Application Data

[63] Continuation of Ser. No. 412,614, Sep. 26, 1989, abandoned, which is a continuation of Ser. No. 255,665, Oct. 11, 1988, abandoned.

[30] Foreign Application Priority Data

Oct. 14, 1987 [DE] Fed. Rep. of Germany ....... 3734770

[51] Int. Cl.$^5$ .......................... B05D 5/12; B05D 1/32; C23C 16/04; C23C 16/52
[52] U.S. Cl. ...................................... 427/99; 427/109; 427/282; 118/697; 118/721; 118/726
[58] Field of Search .................. 427/69, 75, 99, 109, 427/282; 118/720, 721, 697, 726

[56] References Cited

PUBLICATIONS

Brewer et al., "Apparatus for Depositing Thin Fiber Devices", IBM Technical Disclosure Bulletin, vol. 21, No. 7, Dec. 1978, pp. 3016–3018.

*Primary Examiner*—Evan Lawrence
*Attorney, Agent, or Firm*—Hedman, Gibson & Costigan

[57] ABSTRACT

Active matrix addressed liquid crystal TV sets configurated in the way described by A. G. Fischer in U.S. Pat. No. 3,840,695 can be enlarged to monolithic square-meter-sized wall TV panels. The large-area thin-film-electronic matrix circuit needed to address the superimposed liquid crystal layer can be vacuum-deposited from a multiple source evaporator onto one coherent glass pane through a number of small reticulated perforated sheet metal masks which are held successively against a chosen reticle of the large glass pane, in exact registration with each other and neighbouring reticles. The large glass pane must be precision-shifted in X-Y-reticle-steps for repeated vacuum depositions, in exact registration. The machinery required is described.

12 Claims, 1 Drawing Sheet

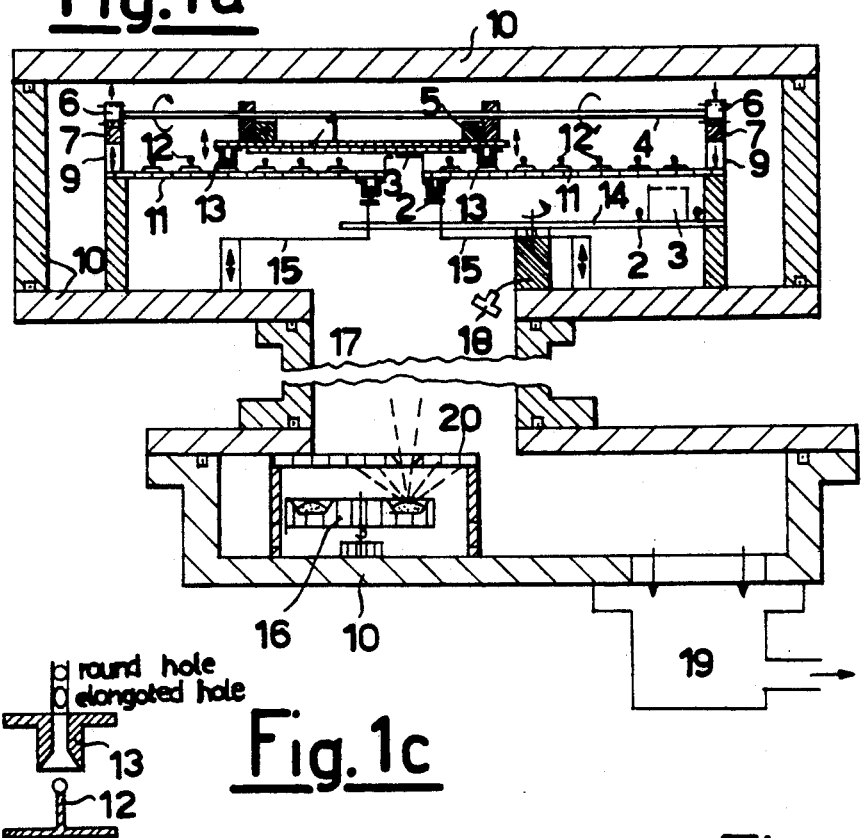
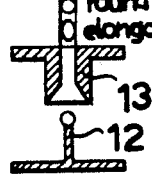
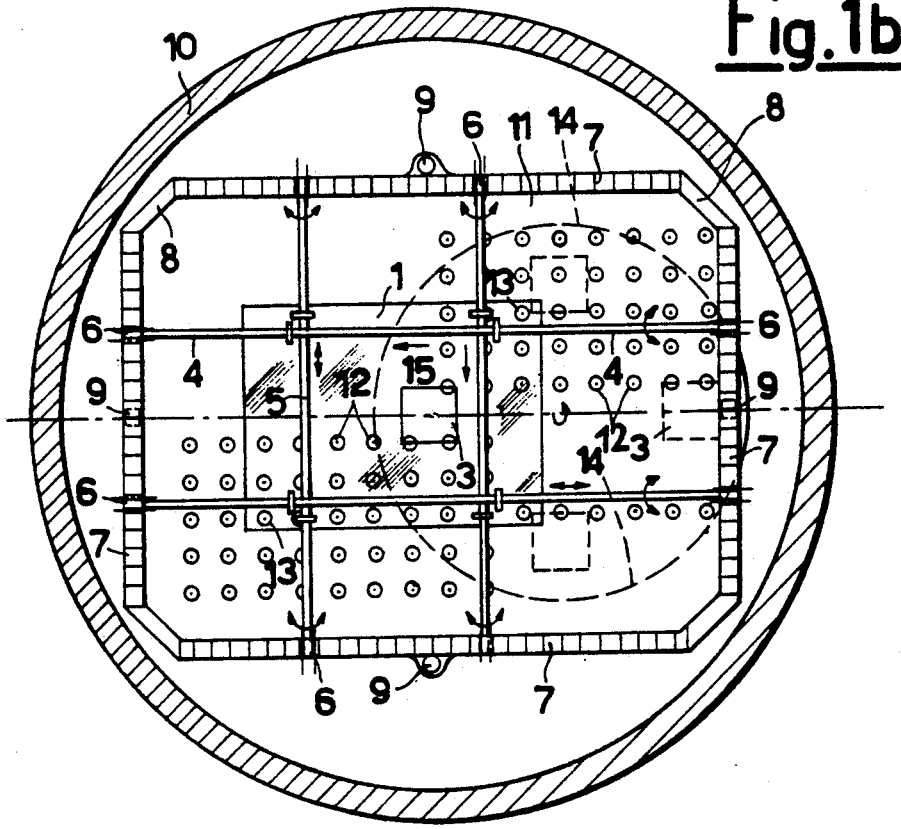

PROCESS AND MACHINERY FOR STEP-AND-REPEAT VACUUM-DEPOSITION OF LARGE-AREA THIN-FILM-ELECTRONICS MATRIX-CIRCUITS ON MONOLITHIC GLASS PANES THROUGH SMALL PERFORATED METAL MASKS

This is a continuation of application Ser. No. 07/412,614, filed Sep. 26, 1989, abandoned, which is a continuation of application Ser. No. 07/255,665, filed Oct. 11, 1988, abandoned.

The rear-illuminated, matrix-addressed liquid crystal colour TV set invented by Fischer 1972 (U.S. Pat. No. 3,840,695 (1974)) can compete against the tubular TV world only if it can be fabricated with a larger display area than what is achievable with tubular TV displays, for example with a size of 90×120 cm for the living room wall.

For this, the requisite thin-film electronics matrix, which has to be placed directly behind the liquid crystal light-controlling film for addressing and storage, would have to be deposited onto one large, monolithic glass pane (1). However, with the presently-available techniques for semiconductor film preparation such as vapour phase epitaxy or sputtering with subsequent contouring by etching through photoresist, or by vacuum deposition of these films by electron-beam-evaporation through photoresist masks or through sheet metal masks, the production of monolithic, square-meter-sized display panels is still not possible today. The reasons are: the requisite apparatus is too large and too expensive; the required photoresist technology, and the optical lens technology, do not yet exist for such large formats, and/or perforated metal masks of this size cannot yet be made with the require accuracy. Further, these processes would not be automatable, thus would require expensive human handiwork. Therefore, the maximum available mask size today is 20×30 cm. For this display area size, however, there are excellent and inexpensive tubular TV sets on the market which are hard to compete with by our novel flat panels.

In order to nevertheless penetrate into the square-meter range, one can compose the large liquid crystal display area of many small "modules" (see A. G. Fischer, Dj. Tizabi, K. Krusch, H. Teves, 1982 Internat. Display Research Conference SID-IEEE Cherry Hill N. J., Proceedings p. 161). However, if one composes the large area, i.e. 90×120 cm. of 100 modules each sized 9×12 cm, the minimization of the visible crevices between adjacent modules, and the reliable production of the thousands of requisite electro-mechanical contacts between adjacent modules, create near-insurmountable difficulties.

In our desire to find a path toward large-area flat LC TV despite these difficulties using our technology which we developed for small flat displays during the past years, we invented the method and the machine for its realization to be described below, which we verified already in the important elementary details.

As we reviewed in 1980 (A. Fischer, NTZ 33, p. 80; 162; 230 (1980)), we fabricate our little (9×12 cm, 100 lines and 100 columns) thin-film transistor matrices by high-vacuum deposition by means of electron beam-heated evaporation, from only a few simple materials, fully automatedly, through several, perforated bimetal masks, onto cold glass panes.

In our approach the masks (3) consist of a "backbone" sheet of 70 um thick iron-nickel foil ("INVAR", having a thermal expansion coefficient as low as that of quartz glass,) which is coated with an electroplated-on film of hard gold-cobalt alloy 3 um thick, into which the actual mask pattern is etched with high accuracy. These thin mask foils are precision-mounted onto sturdy, machined INVAR frames (2) with special adhesive under control via a double microscope, using built-in registration marks for calibration. The registration of the selected mask (3) with the glass substrate (1) and its previous deposition patterns is achieved by means of ball pins (12) and funnel sockets (13). These are very inexpensive precision fittings; the ball pins (12) consists of stainless steel ball bearing balls of 5.000 mm diameter which are spotwelded onto steel pins. The funnel sockets (13) are lathed and honed on automated machines, they have 5.002 um diameter at the narrow end of the funnel.

These framed masks (3,2) and their precision fittings (12,13) are useable thousands of times; after a few hundred evaporations they can be cleaned by immersion into dilute hydrofluoric acid. However, they can not be made much larger than presently.

The present invention relates to the extension of our previously-published small-display technology to the production of much larger, square-meter-sized matrices. This is accomplished by means of reticulated repeated succesive vacuum deposition through our small perforated masks (3) such that the large-area reticulated display matrix can be fabricated without crevices and discontinuities. For this, the problem of exact registration of adjacent reticles had to be solved.

Moreover, since this large display area has to be produced by numerous individual operations, it is imperative that these operations be easily accessible to full automation.

All this has been accomplished in our present invention.

In our previous mini-display project, the matrix sized 9×12 cm containing 100 lines and 100 columns=10,000 pixels was electron-beam-vacuum deposited from a 6-crucible hearth holding 6 materials, through 9 perforated, framed masks which were placed onto the substrate glass pane with exact registration. Before each individual evaporation, the glass substrate was lowered onto the requisite mask which was drawn out of a chest-like reservoir, and registered by means of two couples of ballpins and funnel-sockets, the two ballpins mounted on opposite corners of the mask frames, and the two funnel-sockets being mounted at opposite corners of the substrate holding plate, see, e.g., A. Fischer, Nachrichtentechnische Zeitschrift NTZ 33, p. 30, p. 162, p. 230 (1980).

To allow for thermal expansion of the INVAR plates, the hole in one of the funnel sockets is not round but elongated, in a direction opposing the other socket.

FIG. 1a is a sectional side elevation of a vacuum vessel containing the apparatus of the invention.

FIG. 1b is a sectional view of a vacuum apparatus containing the apparatus of the invention.

FIG. 1c is a sectional view of a funnel-socket.

The large glass pane (1) below its INVAR holding plate (1) is movable in X and Y direction such that new surface reticles of it can be placed above the evaporation chimney (17) and the selected mask (3). This is accomplished via two rotating rods extending in X direction, (4), and two rotating rods extending in Y direction (5), which are mounted in bearing blocks on the upper side of the substrate plate (1), and which carry, at their ends, toothed gears (6) which mesh in the four toothed bars (7), in which they progress driven by stepper motors. The four bars (7) form a stiff rectangular frame (8) which can be raised or lowered evenly by means of four lifting devices (9) (e.g. pneumatic bellows), and which are finally mounted firmly on four columns attached to the vacuum vessel (10).

Below this movable substrate (1) we have a large, intermediate INVAR plate (11) which is firmly mounted to the vacuum vessel (10), and which has an opening above the evaporation chimney (17). On its upper surface this plate (11) carries numerous ballpins (12) which are spaced such that a pair of these ballpins (12) fit into the two funnel sockets (13) that are mounted at the underside on two opposing corners of (1) if the glass plate (1) has been shifted into a new reticle position and lowered by means of the lifting devices (9). Thus, as soon as an approximately-proper position of glass pane (1) has been reached by X-Y-shifting, the pane (1) which is held by rod pair (4) and rod pair (5) on the toothed bar frame (8) is lowered with the bar frame (8) via the lifting device (9) such that the selected pair of ballpins (12) will slide into the two funnel sockets (13) below the pane (1), for exact registration of the pane (1) onto the INVAR plate (11). Now the selected framed mask (3) has to be mated with the selected reticle of the glass substrate (1) from underneath.

For this, our previously-practiced way of mask storage in the form of a "chest of drawers" had to be abandoned (since this would result in selected masks at different levels of altitude), in favour of a mask storage in the form of a rotating disk or carousel (14). This carousel (14), which has along its circumference openings holding the framed masks (3), is located below the intermediate INVAR plate (11). By rotating this disk (14), each mask can be brought successively into the evaporation chimney (17).

Now this selected mask (3) has to be lifted to the selected reticle of the glass pane (1). For this purpose, a lifting stage (15) (which may be agitated pneumatically, for example) touches the selected framed mask (2, 3) from below and raises it from its storage opening of the carousel (14), through the opening in the firmly-mounted INVAR plate (11), until it touches the underside of the glass pane (1). During this operation, the two ball pins (12) that are mounted on the upper face of the mask frame (2) of the selected mask (3) will slip into the corresponding two funnel sockets (13) which are attached to opposing corners of the firmly-mounted INVAR plate (11), for accurate registration. The vacuum deposition of one reticle can now begin.

The electron-beam-heated, multiple evaporation source (16) having, e.g., 6 crucibles with 6 different evaporation materials, is located at the lower end of the evaporation chimney (17). The selection of the particular crucible with its material, and the parameters needed for the respective film to be vacuum-deposited through the selected mask (3) onto the selected reticle of glass pane (1), are stored in and delivered by a compute (not shown). The computer controls the reticulated X-Y-shifting of the large glass pane, the lowering and registering of the glass pane, and holding plate, onto the intermediate plate, the selection and delivery of the selected mask from its circular storage carousel by rotating the carousel, the lifting and registering of the selected mask to the large glass pane, opening of a shutter in the evaporation chimney, the rotation of the multiple-hearth crucible of the electron beam evaporator to the selected evaporation material, the regulation of electron beam strength and sweeping motion for obtaining a vapor beam of controlled strength, the shut-off of the electron gun after having deposited a prescribed film thickness, and the closure of the shutter and withdrawal of the selected mask. A vibrating quartz crystal sensor (18) that is mounted at the upper end of the evaporation channel (17) near the substrate (1), with its requisite electronics, is used for monitoring the achieved film thickness.

The multiple evaporation source (16) is housed in a box (20) made of thick copper plates. This box (20) has a rectangular hole at its top to allow a vapour beam to exit which is just sufficiently narrow to coat the mask (3) and the glass pane reticle (1), not the walls of the chimney (17). The unneeded film deposits inside the box (20) and at the underside of the masks (3) have to be removed and dissolved, after a few hundred evaporation cycles, by dipping these parts into dilute, boric-acid-buffered hydrofluoric acid. In this way the flaking-off of these built-up deposits is avoided; such flakes would create faults in the evaporated layers at the glass substrate (1).

At the lower end of the evaporation chimney (17) is also attached the high vacuum pump (19) with its large plate valve (not shown), and the fore vacuum pump (not shown), as well as sensors to measure the vacuum (not shown). Other vacuum sensors (not shown) are placed at the upper vacuum chamber near the glass substrate (1).

For electronic position sensors which monitor the completion of each process movement we employ tiny magnets which move with the mobile components of the machine past relays and agitate these reed relays which are attached to the immobile components.

The initial adjustment of all ball pin/funnel socket pairs is carried out, after one calibration vacuum deposition for each reticle using titanium metal, by placing a light source at the evaporation source (16) and by observing the light spots at the substrate (1) (made visible there by means of a thin translucent paint film) using a double microscope which permits simultaneous inspection of two diametrically opposed spots on each mask. The ball pins and funnel sockets are initially installed into approximate positions loosely by means of slots and little screws. Once exact registration has been reached by means of shifting under the microscope, these fittings are firmly positioned by means of a drop of "One-Second-Glue", and then the little screws are tightened.

With this new method and means as described above, and modifications thereof which are evident to anyone skilled in the art, it is possible to produce monolithic large-area (e.g. square-meter-sized) thin-film electronic circuit matrices on glass panes, which are suitable—amongst other possible applications—to address large-area light-controlling and light-emitting layers for display panels, especially wall panel television sets.

We claim:

1. A process for the automated production of monolithic large-area thin-film electronics matrix circuits onto large glass panes, especially suited for producing flat, square-meter-sized liquid crystal TV panels, wherein the large-area monolithic thin-film pixel matrix circuit which is square meter sized including peripheral shift and storage registers is vacuum-deposited from a multiple source evaporator through a number of etched small perforated metal foil masks onto one monolithic large glass pane, which is not intentionally heated, in the form of reticles comprising:
  a) successively pressing the small foil masks against a reticle of the large glass pane and vacuum depositing a film layer in exact registration with other film layers and neighboring reticles to deposit the circuit matrix in that reticle;
  b) shifting the glass pane stepwise, in exact registration with the previously deposited film layer, to expose a new reticle to the multiple vacuum deposition until completion of the entire matrix circuit.

2. An apparatus for the production of monolithic large area thin film electronic matrix circuits onto large glass panes by vacuum deposition of multiple film layers on the glass pane in the form of reticles comprising a low thermal expansion holding plate including means for clamping the large glass pane to the underside of said holding plate, means for positioning vacuum deposition masks, at least four bearing-supported, round rotating and sliding precision rods on the face of said holding plate, said rods having precision toothed gears on each end, with at least two of said rods extending in the X direction and at least two of said rods extending in the Y direction, one or more electronic-controlled stepper motors which rotate said rods, and four precision toothed bars, which form a rectangular frame, with which said precision toothed gears on said rods intermesh whereby said rectangular frame is mounted in a vacuum bell jar in such a way that the large glass frame can be shifted in X and Y directions into the approximate positions where the reticular vacuum depositions can take place.

3. The apparatus of claim 2 further comprising means to raise the holding plate, during positioning of the glass plate, and lower the holding plate, for vacuum deposition after reaching an approximately proper X-Y reticle position, a firmly mounted intermediate plate which contains a reticled raster of numerous alignment means precisely arranged on its upper face corresponding to alignment means on the underside of the holding plate wherein when the glass plate is lowered in the proper reticle position the alignment means provide that the glass plate is properly registered to the intermediate plate in each reticle position.

4. The apparatus of claim 3 wherein the alignment means on the upper face of the intermediate plate consist of precision ball pins and the corresponding alignment means on the underside of the holding plate consist of two or more funneled socket fittings for accepting the ball pins.

5. The apparatus of claim 3 further comprising a central evaporation chimney opening in the firmly mounted intermediate plate in which selected small vacuum deposition masks on corresponding elevated mounting frames can be lifted to contact the large glass pane, wherein alignment means are mounted on the upper side of each of the mounting frames which correspond to alignment means on the underside of the intermediate plate adjacent to the chimney opening to assure proper registration of the masks to the intermediate plate and thereby to the reticle positions of the glass plate.

6. The apparatus of claim 5 wherein the alignment means on the upper side of the mounting frames consist of two or more precision ball pins and the corresponding alignment means on the underside of the intermediate plate consist of two or more funneled socket fittings for accepting the ball pins.

7. The apparatus of claim 5 in which the selected small perforated vacuum deposition masks on elevated mounting frames are stored on top of openings which are positioned along the circumference of a metallic carousel disc that is positioned below the firmly mounted intermediate plate such that the mask which has been selected can be placed into the evaporation chimney by controlled rotation of the carousel and lifted by means of a lifted stage through the central evaporation chimney of the intermediate plate until the selected mask contacts the glass plate, wherein proper mask registration is ensured by alignment means on the upper side of the mask mounting frame and corresponding alignment means on the underside of the intermediate plate.

8. The apparatus of claim 7 further comprising a rotating multiple-hearth crucible electron beam evaporator for vacuum depositing a selected evaporation material from below, in high vacuum, after the exact positioning of the large glass pane and the selected mask.

9. The apparatus of claim 8 further comprising a computer which controls the reticulated X-Y-shifting of the large glass pane, the lowering the registering of the glass pane, and holding plate, onto the intermediate plate, the selection and delivery of the selected mask from its circular storage carousel by rotating the carousel, the lifting and registering of the selected mask to the large glass pane, opening of a shutter in the evaporation chimney, the rotation of the multiple-hearth crucible of the electron beam evaporator to the selected evaporation material, the regulation of electron beam strength and sweeping motion for obtaining a vapor beam of controlled strength, the shut-off of the electron gun after having deposited a prescribed film thickness, and the closure of the shutter and withdrawal of the selected mask.

10. The apparatus of claim 2 wherein the low expansion holding plate is made of an iron-nickel (27% Ni, 73% Fe=INVAR) steel.

11. The apparatus of claim 3 wherein the low expansion holding plate and the intermediate plate is made of an iron-nickel (27% Ni, 73% Fe=INVAR) steel.

12. The apparatus of claim 5 wherein the low expansion holding plate, the intermediate plate and the mask mounting frames are made of an iron-nickel (27% Ni, 73% Fe=INVAR) steel.

* * * * *